(12) United States Patent
Nakatani

(10) Patent No.: US 8,735,948 B2
(45) Date of Patent: May 27, 2014

(54) SEMICONDUCTOR DEVICE

(75) Inventor: Goro Nakatani, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 217 days.

(21) Appl. No.: 12/270,323

(22) Filed: Nov. 13, 2008

(65) Prior Publication Data

US 2010/0117124 A1   May 13, 2010

(30) Foreign Application Priority Data

Nov. 13, 2007 (JP) ................................ 2007-294446

(51) Int. Cl.
*H01L 29/84* (2006.01)
(52) U.S. Cl.
USPC .................................. 257/254; 257/E29.324
(58) Field of Classification Search
None
See application file for complete search history.

(56) References Cited

U.S. PATENT DOCUMENTS

| | | | |
|---|---|---|---|
| 5,596,219 A | 1/1997 | Hierold | |
| 5,830,372 A | 11/1998 | Hierold | |
| 6,140,689 A * | 10/2000 | Scheiter et al. | 257/414 |
| 6,320,239 B1 | 11/2001 | Eccardt et al. | |
| 6,531,331 B1 * | 3/2003 | Bennett et al. | 438/48 |
| 6,677,176 B2 * | 1/2004 | Wong et al. | 438/50 |
| 7,402,449 B2 * | 7/2008 | Fukuda et al. | 438/53 |
| 2006/0022285 A1 * | 2/2006 | Matsubara et al. | 257/416 |
| 2007/0029894 A1 * | 2/2007 | Yamaoka et al. | 310/311 |
| 2007/0224832 A1 * | 9/2007 | Zurcher | 438/758 |
| 2010/0044147 A1 * | 2/2010 | Wang | 181/164 |

FOREIGN PATENT DOCUMENTS

| | | |
|---|---|---|
| JP | 7-326809 | 12/1995 |
| JP | 2001-502871 | 2/2001 |
| JP | 2001-508940 | 7/2001 |
| JP | 2006-108491 | 4/2006 |
| JP | 2006-270408 | 10/2006 |
| WO | WO 2007/004119 A2 | 1/2007 |

\* cited by examiner

*Primary Examiner* — Benjamin Sandvik
(74) *Attorney, Agent, or Firm* — Rabin & Berdo, P.C.

(57) ABSTRACT

A semiconductor device according to the present invention includes: a semiconductor substrate; a source region formed in a top layer portion of the semiconductor substrate; a drain region formed in the top layer portion of the semiconductor substrate and spaced apart from the source region; a gate electrode formed on the semiconductor substrate and opposing to an interval between the source region and the drain region; a wiring formed on the semiconductor substrate and connected to the source region, the drain region, or the gate electrode; and a MEMS sensor disposed on the semiconductor substrate. The MEMS sensor includes: a thin film first electrode made of the same material as the gate electrode and formed in the same layer as the gate electrode; and a second electrode made of the same material as the wiring, formed in the same layer as the wiring, and spaced apart from the first electrode at a side opposite to the semiconductor substrate side of the first electrode.

14 Claims, 10 Drawing Sheets

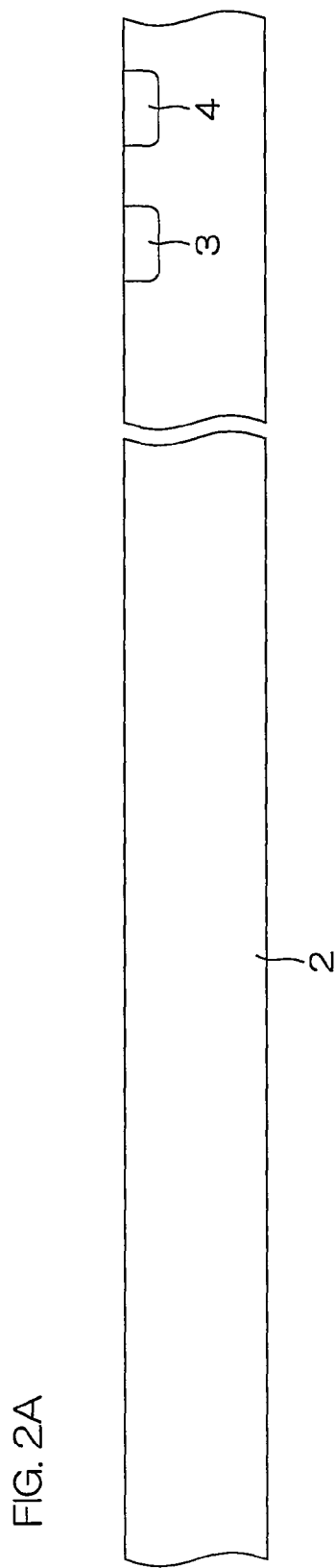

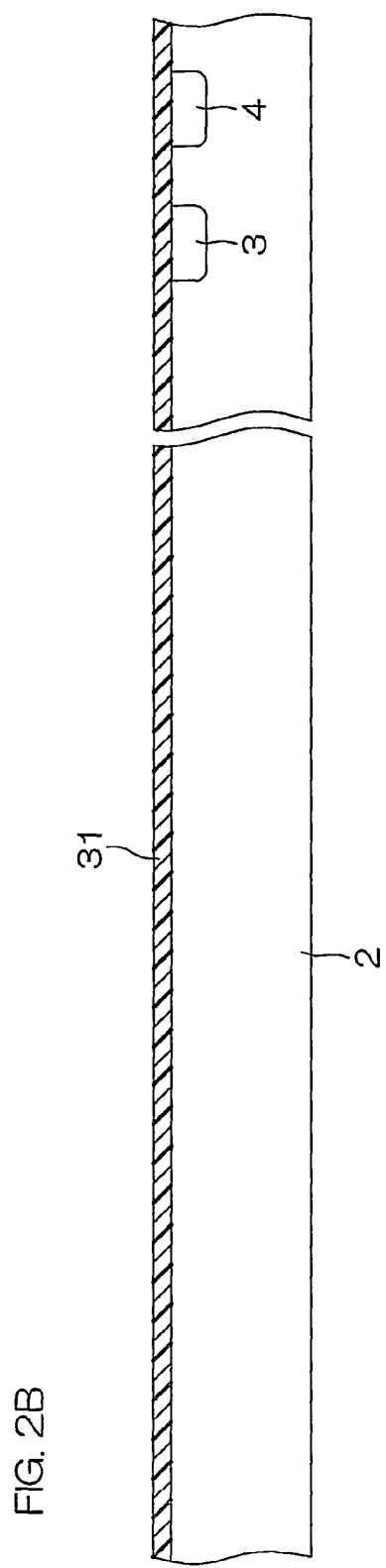

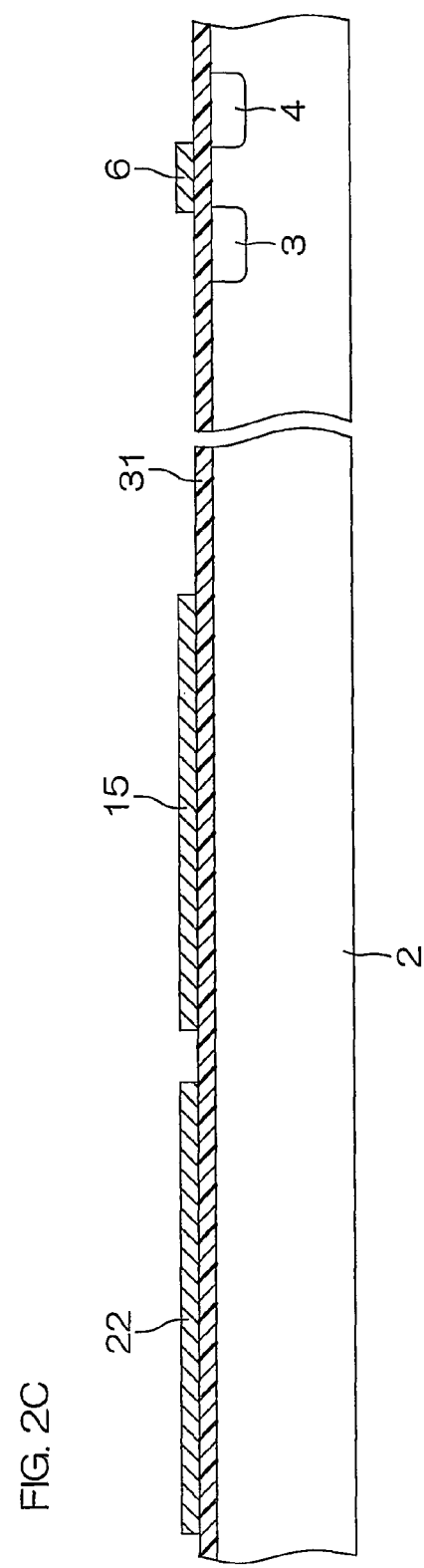

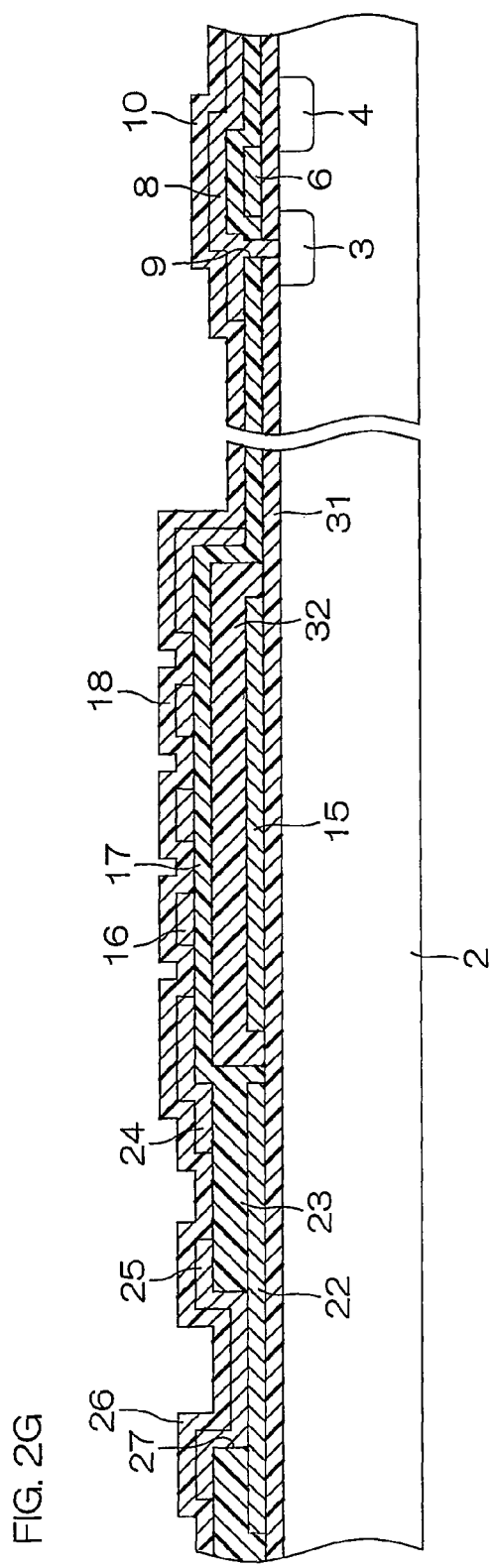

SEMICONDUCTOR DEVICE

BACKGROUND OF THE INVENTION

1. Field of the Invention

The present invention relates to a semiconductor device including an Si (silicon) microphone or other MEMS (Micro Electro Mechanical Systems) sensor.

2. Description of Related Art

Due to Si microphones manufactured by an MEMS technique being recently equipped in cell phones in place of ECMs (Electret Condenser Microphones), Si microphones are rapidly drawing increasing attention.

An Si microphone has a structure where, for example, an opening is formed at a central portion of a silicon substrate, a diaphragm is disposed opposite to the opening on a top surface of the silicon substrate, and a back plate is disposed opposite to and spaced apart from the diaphragm by a minute interval. When a sound pressure (sound wave) is input, the diaphragm vibrates. When the diaphragm vibrates in a state where a voltage is applied between the diaphragm and the back plate, a capacitance of a capacitor formed by the diaphragm and the back plate changes, and a variation of voltage between the diaphragm and the back plate resulting from the change of capacitance is output as an audio output signal.

It is said that the Si microphone having such a structure can be integrated in a single chip with a chip equipped with a signal processing circuit or other integrated circuit. However, single chip integration of an Si microphone and an integrated circuit chip has not been realized as of yet, and an Si microphone and an integrated circuit chip are provided individually as separate parts.

SUMMARY OF THE INVENTION

An object of the present invention is to provide a semiconductor device that enables an Si microphone or other MEMS sensor and a semiconductor element to be integrated in a single chip while avoiding complication of configuration.

A semiconductor device according to one aspect of the present invention includes: a semiconductor substrate; a source region formed in a top layer portion of the semiconductor substrate; a drain region formed in the top layer portion of the semiconductor substrate and spaced apart from the source region; a gate electrode formed on the semiconductor substrate and opposing to a region between the source region and the drain region; a wiring formed on the semiconductor substrate and connected to the source region, the drain region, or the gate electrode; and a MEMS sensor disposed on the semiconductor substrate. The MEMS sensor includes: a thin film first electrode made of the same material as the gate electrode and formed in the same layer as the gate electrode; and a second electrode made of the same material as the wiring, formed in the same layer as the wiring, and spaced apart from the first electrode at a side opposite to the semiconductor substrate side of the first electrode.

The MEMS sensor including the first electrode and the second electrode is disposed on the semiconductor substrate. Because the first electrode is formed as a thin film, the first electrode vibrates when a pressure (for example, a sound pressure) is input. When the first electrode vibrates, a capacitance of a capacitor formed by the first electrode and the second electrode changes. Thus, based on an amount of change of the capacitance, the pressure input into the first electrode can be determined.

The source region and the drain region formed in the semiconductor substrate and the gate electrode formed on the semiconductor substrate form a field effect transistor (FET). This field effect transistor can be used in an integrated circuit such as a signal processing circuit processing a signal that is in accordance with the amount of change of the capacitance of the capacitor formed by the first electrode and the second electrode.

The gate electrode and the first electrode are formed in the same layer, and the second electrode and the wiring connected to the source region, the drain region, or the gate electrode are formed in the same layer. The MEMS sensor and the field effect transistor can thus be integrated in a single chip while avoiding complication of configuration. Consequently, single chip integration of the MEMS sensor and the integrated circuit chip can be achieved.

A material of the gate electrode and the first electrode may be polysilicon. Further, a material of the wiring and the second electrode may be aluminum.

The foregoing and other objects, features, and effects of the present invention will become more apparent from the following detailed description of the embodiments with reference to the attached drawings.

BRIEF DESCRIPTION OF THE DRAWINGS

FIG. 2A is a schematic sectional view for describing a method for manufacturing the semiconductor device.

FIG. 2B is a schematic sectional view of a step subsequent to that of FIG. 2A.

FIG. 2C is a schematic sectional view of a step subsequent to that of FIG. 2B.

FIG. 2G is a schematic sectional view of a step subsequent to that of FIG. 2F.

DETAILED DESCRIPTION OF PREFERRED EMBODIMENTS

An embodiment of the present invention shall now be described in detail with reference to the attached drawings.

Figure 1:
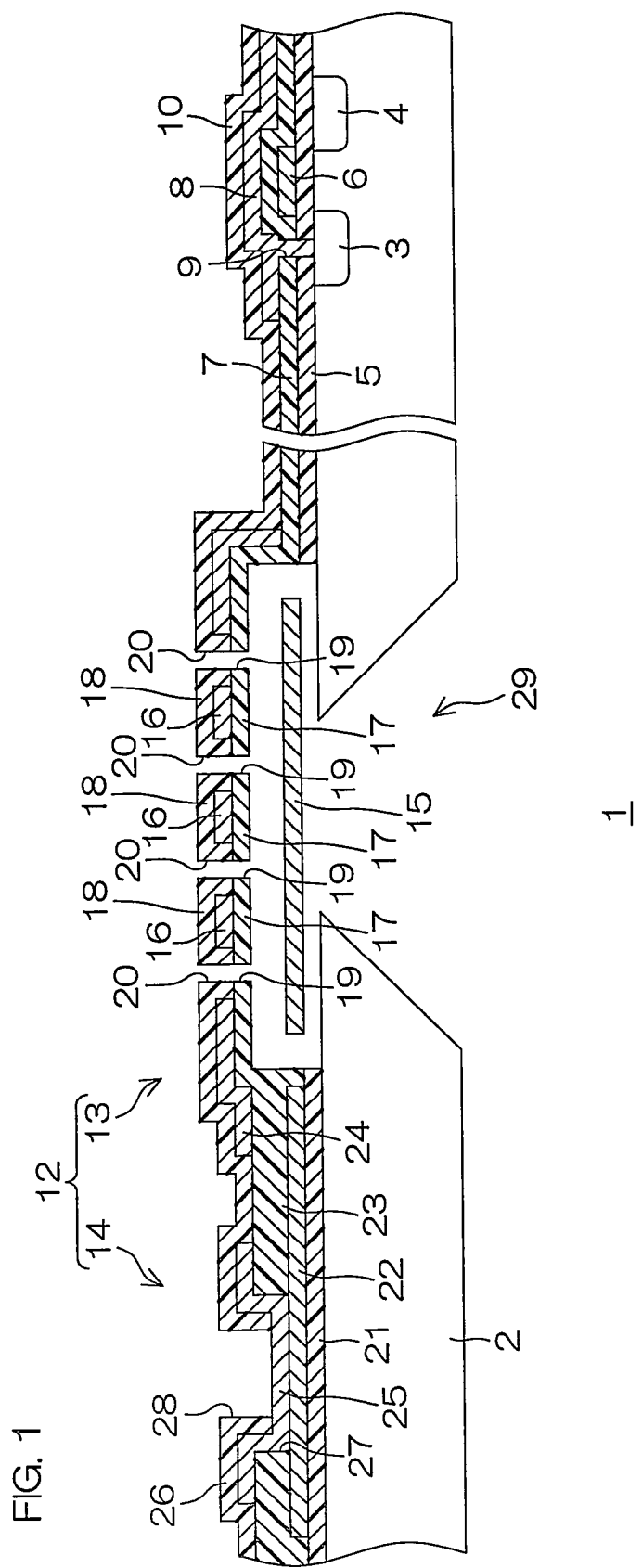
FIG. 1 is a schematic sectional view of a structure of a semiconductor device according to an embodiment of the present invention.

FIG. 1 is a schematic sectional view of a structure of a semiconductor device according to an embodiment of the present invention.

The semiconductor device 1 includes a semiconductor substrate (for example, a silicon substrate) 2.

In a top layer portion of the semiconductor substrate 2, a source region 3 and a drain region 4 are formed spaced apart from each other in an element forming region insulatingly separated from surroundings of the element forming region.

In the element forming region, a gate insulating film 5 made of $SiO_2$ (silicon oxide) is formed on the semiconductor substrate 2. On the gate insulating film 5, a gate electrode 6 made of polysilicon is formed at a position opposite to a channel region between the source region 3 and the drain region 4. The semiconductor device 1 thus includes a MOS-FET (Metal Oxide Semiconductor Field Effect Transistor)

formed of the source region 3, the drain region 4, the gate insulating film 5 and the gate electrode 6.

Top surfaces of the gate insulating film 5 and the gate electrode 6 are covered by an interlayer film 7 made of SiN (silicon nitride). A source wiring 8 made of Al (aluminum) is formed on the interlayer film 7. The source wiring 8 is connected to the source region 3 via a contact hole 9 penetrating through the gate insulating film 5 and the interlayer film 7.

Top surfaces of the interlayer film 7 and the source wiring 8 are covered by a passivation film 10 made of SiN.

The semiconductor device 1 includes a MEMS sensor 12. The MEMS sensor 12 is disposed on the semiconductor substrate 2 and has a sensor portion 13 and a pad portion 14.

The sensor portion 13 includes a thin film lower electrode 15 disposed opposite to a top surface of the semiconductor substrate 2 and a mesh upper electrode 16 disposed opposite to the lower electrode 15.

The lower electrode 15 is made of polysilicon which is the same material as the gate electrode 6 and is formed in the same layer as the gate electrode 6. The lower electrode 15 thus opposes to the top surface of the semiconductor substrate 2 at an interval equal to a thickness of the gate insulating film 5. The interval between the lower electrode 15 and the top surface of the semiconductor substrate 2 is a gap.

The upper electrode 16 is made of Al which is the same material as the source wiring 8, and is formed in the same layer as the source wiring 8. The upper electrode 16 is coated by a lower coating film 17 and an upper coating film 18.

The lower coating film 17 is made of SiN and is formed integrally to the interlayer film 7. The lower coating film 17 coats the upper electrode 16 from below. In the lower coating film 17, microscopic holes 19 are formed penetratingly in the thickness direction at positions opposite to the respective holes in the upper electrode 16. A gap having a predetermined interval is formed between the lower coating film 17 and the lower electrode 15.

The upper coating film 18 is made of SiN and is formed integrally to the passivation film 10. The upper coating film 18 covers the upper electrode 16 from above. In the upper coating film 18, holes 20 of the same shape in a plan view as the holes 19 in the lower coating film 17 are formed penetratingly in the thickness direction at positions opposite to the respective holes 19.

The pad portion 14 includes a first insulating film 21, a lower wiring 22, a second insulating film 23, an upper wiring 24, a pad 25, and a passivation film 26.

The first insulating film 21 is made of $SiO_2$ and is formed integrally to the gate insulating film 5. The first insulating film 21 is laminated on the top surface of the semiconductor substrate 2 and surrounds a periphery of the sensor portion 13 (periphery of the gap between the lower electrode 15 and the lower coating film 17).

The lower wiring 22 is made of polysilicon which is the same material as the gate electrode 6 and the lower electrode 15, and is formed on the first insulating film 21. The lower wiring 22 is connected to the lower electrode 15 and supports the lower electrode 15 in a manner enabling vibration.

The second insulating film 23 is made of SiN. The second insulating film 23 covers top surfaces of the first insulating film 21 and the lower wiring 22. The second insulating film 23 is formed integrally to the interlayer film 7 and the lower coating film 17 and supports the lower coating film 17.

The upper wiring 24 is made of Al which is the same material as the source wiring 8 and the upper electrode 16. The upper wiring 24 is connected to the upper electrode 16.

The pad 25 is made of Al which is the same material as the source wiring 8, the upper electrode 16 and the upper wiring 24. An opening 27 for partially exposing the lower wiring 22 is formed in the second insulating film 23. The pad 25 covers the lower wiring 22 inside the opening 27 and a peripheral edge thereof is formed in a state of riding on the second insulating film 23.

The passivation film 26 is made of SiN. The passivation film 26 covers the second insulating film 23, the upper wiring 24 and the peripheral edge of the pad 25. The passivation film 26 has a pad opening 28 for exposing a central portion of the pad 25 (portion being in contact with the lower wiring 22). The passivation film 26 is formed integrally to the passivation film 10 and the upper coating film 18 and supports the upper coating film 18.

In the semiconductor substrate 2, an opening 29 of substantially trapezoidal shape in sectional view that narrows as the lower electrode 15 is approached is formed at a position opposite to the lower electrode 15.

FIGS. 2A to 2I are schematic sectional views for describing a method for manufacturing the semiconductor device shown in FIG. 1.

First, as shown in FIG. 2A, the source region 3 and the drain region 4 are formed in the top layer portion of the semiconductor substrate 2 by an ion implantation method.

Then, as shown in FIG. 2B, a silicon oxide film 31 is formed on the top surface of the semiconductor substrate 2 by a thermal oxidation process.

Thereafter, a polysilicon film is formed across an entire upper side of the silicon oxide film 31 by a thermal CVD (Chemical Vapor Deposition) method. Thereafter, the polysilicon film is selectively removed by a photolithography and an etching. The gate electrode 6, the lower electrode 15 and the lower wiring 22 are thereby formed as shown in FIG. 2C.

Figure 2D:
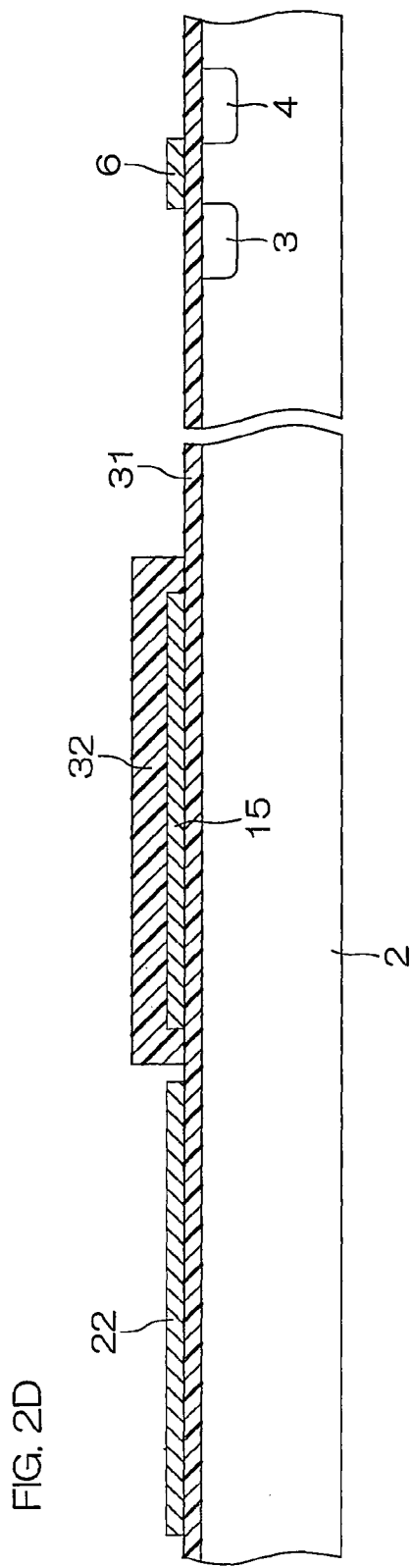
FIG. 2D is a schematic sectional view of a step subsequent to that of FIG. 2C.

$SiO_2$ is then deposited across an entire upper side of the silicon oxide film 31 (including the gate electrode 6, the lower electrode 15 and the lower wiring 22) by a PECVD (Plasma Enhanced Chemical Vapor Deposition) method. Then, the $SiO_2$ deposition layer is then removed selectively by the photolithography technique and the etching technique. A sacrificial layer 32 coating a top surface of the lower electrode 15 is thereby formed as shown in FIG. 2D.

Figure 2E:
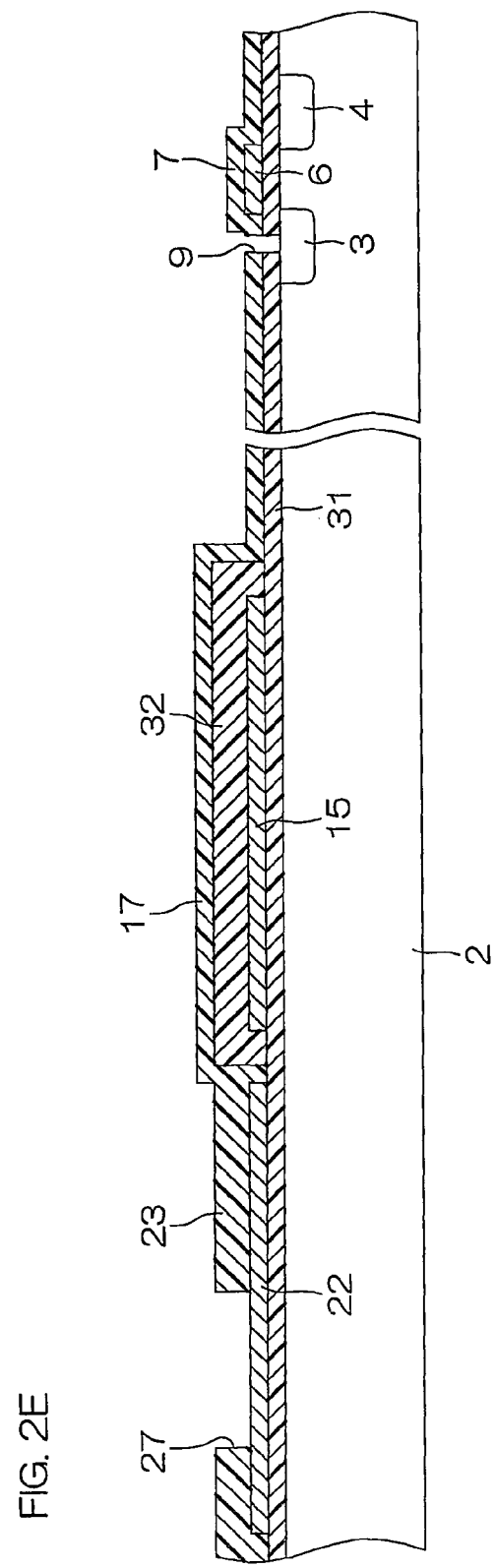
FIG. 2E is a schematic sectional view of a step subsequent to that of FIG. 2D.

After forming the sacrificial layer 32, SiN is deposited across the entire upper side of the silicon oxide film 31 (including the gate electrode 6, the lower wiring 22 and an upper side of the sacrificial layer 32) by the PECVD method as shown in FIG. 2E. The interlayer film 7, the lower coating film 17 and the second insulating film 23 are thereby formed. The contact hole 9 is then formed in the gate insulating film 5 and the interlayer film 7 and the opening 27 is formed in the second insulating film 23 by the photolithography and the etching.

Then, an Al film is formed across an entire topmost surface of the structure shown in FIG. 2E by a sputter method. The Al film is then patterned by the photolithography and the etching. The source wiring 8, the upper electrode 16, the upper wiring 24 and the pad 25 are thereby formed as shown in FIG. 2F.

Figure 2F:
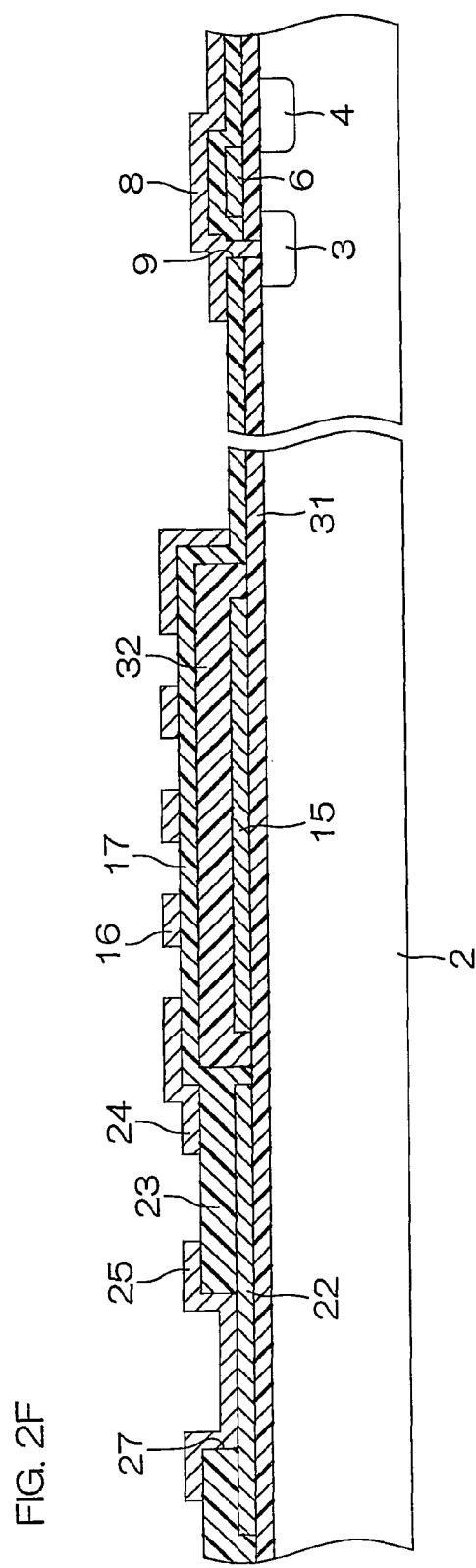
FIG. 2F is a schematic sectional view of a step subsequent to that of FIG. 2E.

Thereafter, as shown in FIG. 2G, SiN is deposited across an entire topmost surface of the structure shown in FIG. 2F by the PECVD method. The passivation film 10, the upper coating film 18 and the passivation film 26 are thereby formed.

Figure 2H:
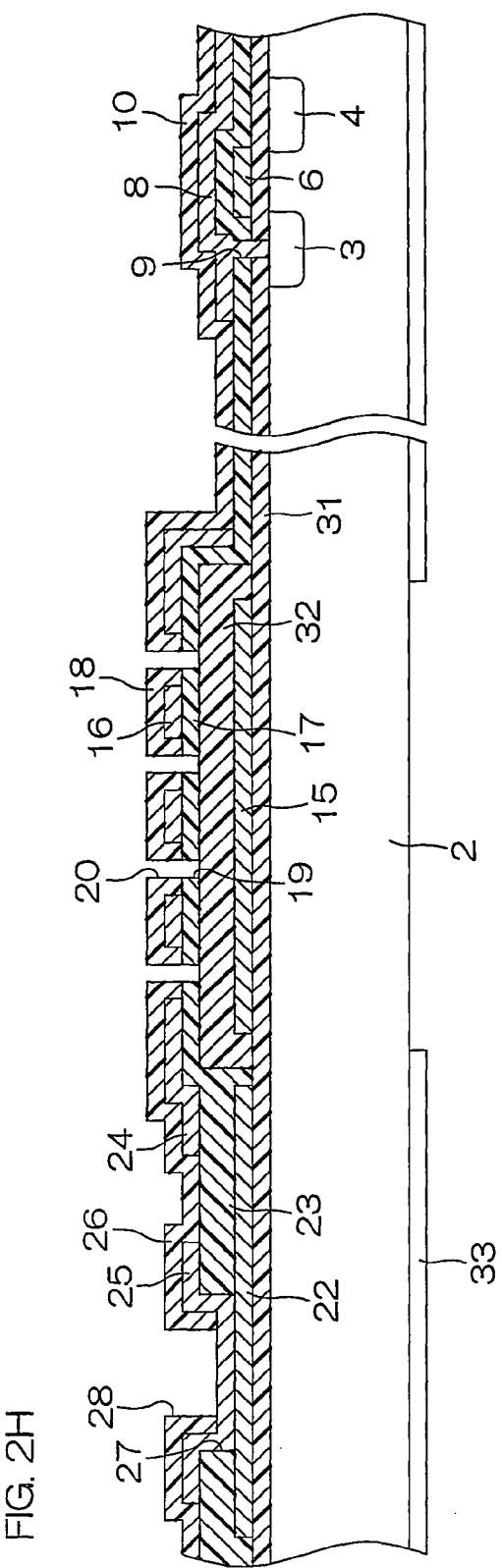
FIG. 2H is a schematic sectional view of a step subsequent to that of FIG. 2G.

Next, as shown in FIG. 2H, holes 20 and 19 are successively formed in the upper coating film 18 and the lower coating film 17, respectively, by the photolithography and the etching. Further, the pad opening 28 is formed in the passivation film 26. Still further, a resist pattern 33 having an opening opposite to a region in which the opening 29 is to be formed is formed on a rear surface of the semiconductor substrate 2.

Figure 2I:
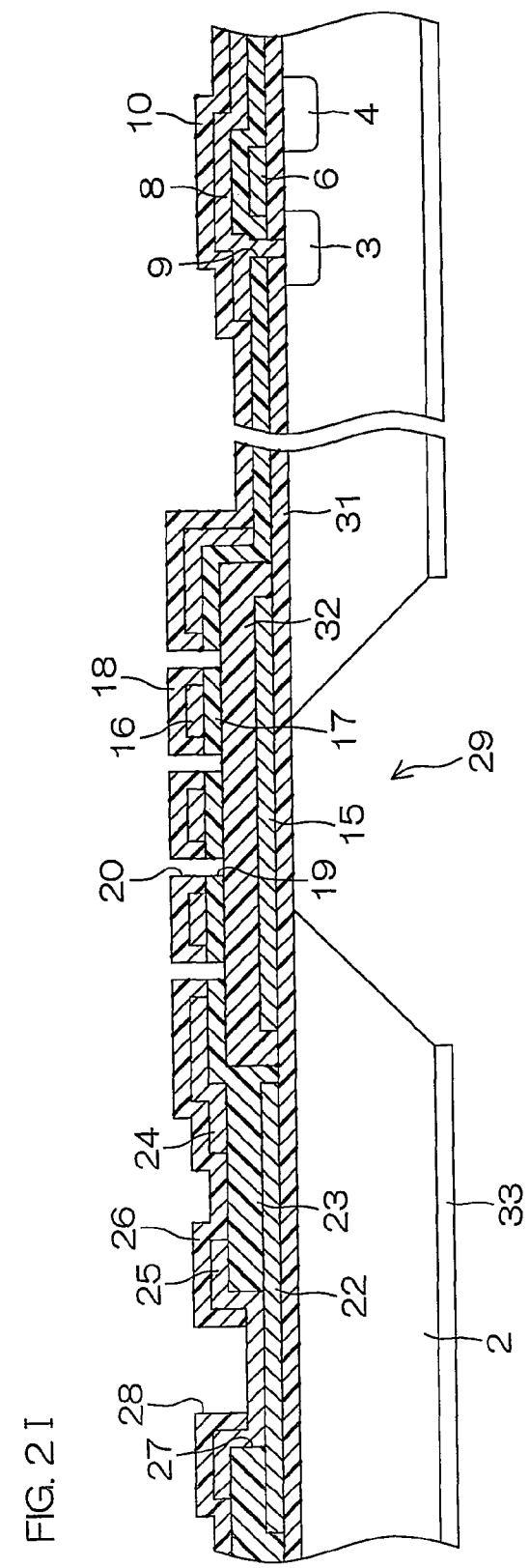
FIG. 2I is a schematic sectional view of a step subsequent to that of FIG. 2H.

Thereafter, as shown in FIG. 2I, the semiconductor substrate 2 is etched using the resist pattern 33 as a mask to penetratingly form the opening 29 in the semiconductor substrate 2.

Then, by an etching solution (for example, hydrofluoric acid) being supplied from the holes 19 and 20 and the opening 29, the sacrificial layer 32 and a portion of the silicon oxide film 31 in contact with the sacrificial layer 32 are removed. The silicon oxide film 31 thereby becomes the gate insulating film 5 and the first insulating film 21. Further, a gap is formed between the semiconductor substrate 2 and the lower electrode 15, a gap is formed between the lower electrode 15 and the lower coating film 17, and the lower electrode 15 is put in a vibratable state.

As described above, the MEMS sensor 12 including the lower electrode 15 and the upper electrode 16 is disposed on the semiconductor substrate 2. Because the lower electrode 15 is formed as a thin film, it vibrates when a pressure (for example, a sound pressure) is input. When the lower electrode 15 vibrates, a capacitance of a capacitor formed by the lower electrode 15 and the upper electrode 16 changes. Thus, based on an amount of change of the capacitance, the pressure input into the lower electrode 15 can be determined.

The source region 3 and the drain region 4 formed in the semiconductor substrate 2 and the gate electrode 6 formed on the semiconductor substrate 2 form a MOSFET. This MOSFET can be used in an integrated circuit such as a signal processing circuit processing a signal that is in accordance with the amount of change of the capacitance of the capacitor formed by the lower electrode 15 and the upper electrode 16.

The gate electrode 6 and the lower electrode 15 are formed in the same layer, and the source wiring 8 and the upper electrode 16 are formed in the same layer. The MEMS sensor 12 and the MOSFET can thus be integrated in a single chip while avoiding complication of configuration. Consequently, single chip integration of the MEMS sensor 12 and the integrated circuit chip can be achieved.

Although the interlayer film 7, the passivation film 10, the lower coating film 17, the upper coating film 18, the second insulating film 23 and the passivation film 26 were described as being made of SiN, the material of these components is not limited to SiN and may be any insulating material having an etching selectivity ratio with respect to $SiO_2$.

Further, the material of the source wiring 8, the upper electrode 16, the upper wiring 24, and the pad 25 is not limited to Al, and Au or other metal may be used instead.

While the present invention has been described in detail byway of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2007-294446, filed with the Japan Patent Office on Nov. 13, 2007, the disclosure of which is incorporated herein by reference.

What is claimed is:

1. A semiconductor device comprising:
a semiconductor substrate having a top surface and a bottom surface;
a source region formed in a top layer portion of the semiconductor substrate;
a drain region formed in the top layer portion of the semiconductor substrate and spaced apart from the source region;
a gate insulating film formed on the semiconductor substrate;
a gate electrode formed on the gate insulating film and opposing a region between the source region and the drain region;
a wiring formed on the semiconductor substrate and connected to the source region, the drain region, or the gate electrode; and
a MEMS (Micro Electro Mechanical System) sensor disposed on the semiconductor substrate, the MEMS sensor including:
a first electrode made of a same material as the gate electrode and formed as a thin film in a same layer as the gate electrode;
a second electrode made of a same material as the wiring, formed in a same layer as the wiring, and spaced apart from the first electrode at a side opposite to the semiconductor substrate side of the first electrode, defining a first gap between the first electrode and the second electrode;
a lower coating film that coats a lower part of the second electrode; and
an upper coating film that coats an upper part of the second electrode;
wherein the substrate has a hole penetrating therethrough between the top and bottom surfaces thereof;
wherein an opening of the hole is formed in an area facing the first electrode on the top surface of the substrate;
wherein the first electrode opposes the top surface of the semiconductor substrate at an interval equal to a thickness of the gate insulating film, so that the top surface of the semiconductor substrate is spaced away from the first electrode to define a second gap corresponding to the thickness of the gate insulating film between the first electrode and the top surface of the semiconductor substrate;
wherein the first gap and the second gap communicate with each other through a communicating space extending in a direction perpendicular to the top surface of the substrate;
wherein the second electrode has a plurality of holes that penetrate therethrough, and are arranged in a uniformly spaced relation at least in a region opposed to the opening of the hole of the substrate;
wherein a lower surface and an upper surface of the lower coating film are flat at least in a region that the first electrode faces the second electrode;
wherein a lower surface and an upper surface of the second electrode are flat at least in the region that the first electrode faces the second electrode;
wherein a surface of the upper coating film is flat at least in the region that the first electrode faces the second electrode; and
wherein sides of the second electrode perpendicular to the top surface of the semiconductor substrate are covered by the upper coating film.

2. The semiconductor device according to claim 1, wherein:
the material of the gate electrode and the first electrode is polysilicon; and
the material of the wiring and the second electrode is aluminum.

3. The semiconductor device according to claim 1, further comprising a space defining structure arranged to define, in cooperation with the semiconductor substrate, a space surrounding and accommodating the first electrode.

4. The semiconductor device according to claim 1, wherein the second electrode is a mesh electrode.

5. The semiconductor device according to claim 1, wherein the plurality of holes that penetrate through the second electrode includes a first hole that penetrates therethrough, and the upper and lower coating films have second and third holes, respectively, that penetrate therethrough and that are aligned with the first hole.

6. The semiconductor device according to claim 1, further comprising a passivation film, wherein the upper coating film is formed integrally with the passivation film.

7. The semiconductor device according to claim 1, wherein the opening is formed under the MEMS sensor across the second gap.

8. The semiconductor device according to claim 1, wherein all of the hole and all of the gap and the coating films constructing the MEMS sensor extend in a horizontal direction along the top surface of the semiconductor substrate or in a perpendicular direction perpendicular to the top surface of the semiconductor substrate.

9. A semiconductor device comprising:
   a semiconductor substrate having a top surface and a bottom surface;
   a source region formed in a top layer portion of the semiconductor substrate;
   a drain region formed in the top layer portion of the semiconductor substrate and spaced apart from the source region;
   a gate insulating film formed on the semiconductor substrate;
   a gate electrode formed on the gate insulating film and opposing a region between the source region and the drain region;
   a wiring formed on the semiconductor substrate and connected to the source region, the drain region, or the gate electrode;
   a MEMS (Micro Electro Mechanical System) sensor disposed on the semiconductor substrate, the MEMS sensor including:
      a first electrode made of a same material as the gate electrode and formed as a thin film in a same layer as the gate electrode;
      a second electrode made of a same material as the wiring, formed in a same layer as the wiring, and spaced apart from the first electrode at a side opposite to the semiconductor substrate side of the first electrode, defining a first gap between the first electrode and the second electrode;
      a lower coating film that coats a lower part of the second electrode; and
      an upper coating film that coats an upper part of the second electrode;
   wherein the substrate has a hole penetrating therethrough between the top and bottom surfaces thereof;
   wherein an opening of the hole is formed in an area facing the first electrode on the top surface of the substrate;
   wherein the first electrode opposes the top surface of the semiconductor substrate at an interval equal to a thickness of the gate insulating film, so that the top surface of the semiconductor substrate is spaced away from the first electrode to define a second gap corresponding to the thickness of the gate insulating film between the first electrode and the top surface of the semiconductor substrate;
   wherein the first gap and the second gap communicate with each other through a communicating space extending in a direction perpendicular to the top surface of the substrate;
   wherein the second electrode has a plurality of holes that penetrate therethrough, and are arranged in a uniformly spaced relation at least in a region opposed to the opening of the hole of the substrate;
   wherein a lower surface and an upper surface of the lower coating film are flat at least in a region that the first electrode faces the second electrode;
   wherein a lower surface and an upper surface of the second electrode are flat at least in the region that the first electrode faces the second electrode;
   wherein a surface of the upper coating film is flat at least in the region that the first electrode faces to the second electrode, so that an outline made of the upper coating film and the lower coating film is flat at least in the region that the first electrode faces the second electrode; and
   wherein sides of the second electrode perpendicular to the top surface of the semiconductor substrate are covered by the upper coating film.

10. The semiconductor device according to claim 9, wherein:
   the material of the gate electrode and the first electrode is polysilicon; and
   the material of the wiring and the second electrode is aluminum.

11. The semiconductor device according to claim 9, further comprising a space defining structure arranged to define, in cooperation with the semiconductor substrate, a space surrounding and accommodating the first electrode.

12. The semiconductor device according to claim 9, wherein the second electrode is a mesh electrode.

13. The semiconductor device according to claim 9, wherein the plurality of holes that penetrate through the second electrode includes a first hole that penetrates therethrough, and the upper and lower coating films have second and third holes, respectively, that penetrate therethrough and that are aligned with the first hole.

14. The semiconductor device according to claim 9, further comprising a passivation film, wherein the upper coating film is formed integrally with the passivation film.

* * * * *